(12) United States Patent
Obata et al.

(10) Patent No.: US 10,796,926 B2
(45) Date of Patent: Oct. 6, 2020

(54) METHOD OF MANUFACTURING GLASS INTERPOSER

(71) Applicant: DISCO CORPORATION, Tokyo (JP)

(72) Inventors: Tsubasa Obata, Tokyo (JP); Satoshi Kumazawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 144 days.

(21) Appl. No.: 16/034,630

(22) Filed: Jul. 13, 2018

(65) Prior Publication Data
US 2019/0019692 A1    Jan. 17, 2019

(30) Foreign Application Priority Data

Jul. 14, 2017 (JP) .................. 2017-137823

(51) Int. Cl.
*H01L 21/48*    (2006.01)
*H01L 23/498*    (2006.01)
(Continued)

(52) U.S. Cl.
CPC ...... *H01L 21/4846* (2013.01); *B23K 26/0006* (2013.01); *B23K 26/08* (2013.01); *B23K 26/364* (2015.10); *B23K 26/402* (2013.01); *B23K 26/53* (2015.10); *C03B 33/0222* (2013.01); *C03B 33/033* (2013.01); *C03B 33/07* (2013.01); *C03B 33/074* (2013.01); *H01L 21/486* (2013.01); *H01L 23/15* (2013.01); *H01L 23/49827* (2013.01); *H01L 23/49838* (2013.01); *H01L 23/49894* (2013.01); *B23K 2101/40* (2018.08);
(Continued)

(58) Field of Classification Search
CPC ...... B23K 26/53; B23K 26/402; B23K 26/08; B23K 26/0006; B23K 26/364; B23K 2103/172; B23K 2103/54; B23K 2101/40; B23K 2101/42; H01L 23/15; H01L 23/49894; H01L 23/49822; C03B 33/074; C03B 33/0222; C03B 33/033; C03B 33/07
See application file for complete search history.

(56) References Cited

U.S. PATENT DOCUMENTS

2015/0321942 A1* 11/2015 Masuda ................. B23K 26/40
                                                                428/337
2015/0367621 A1* 12/2015 Murashige ............ C03B 33/074
                                                                156/250
2018/0134607 A1*  5/2018 Ichikawa ................. C03C 17/32

FOREIGN PATENT DOCUMENTS

JP      2004158776 A      6/2004
JP      2015146401 A      8/2015
JP      2015198212 A      11/2015

* cited by examiner

*Primary Examiner* — Queenie S Dehghan
(74) *Attorney, Agent, or Firm* — Greer Burns & Crain Ltd.

(57) ABSTRACT

In a method of manufacturing a glass interposer, first, stacked bodies formed on a front surface and a back surface of a glass substrate are processed along division lines (streets) to form first grooves having a first width and such a depth as not to reach the glass substrate, while leaving a residual resin portion at bottoms of the first grooves. Thereafter, the residual resin portion is subjected to ablation processing to expose the front surface and the back surface of the glass substrate, thereby forming second grooves having a second width narrower than the first width. A laser beam is applied along the division lines through the second grooves to form modified layers in the inside of the glass substrate, and an external force is exerted on the glass substrate to divide the glass substrate, with the modified layers as division starting points.

2 Claims, 5 Drawing Sheets

(51) Int. Cl.
  *C03B 33/033* (2006.01)
  *C03B 33/02* (2006.01)
  *C03B 33/07* (2006.01)
  *B23K 26/364* (2014.01)
  *B23K 26/00* (2014.01)
  *B23K 26/08* (2014.01)
  *H01L 23/15* (2006.01)
  *B23K 26/402* (2014.01)
  *B23K 26/53* (2014.01)
  *B23K 103/00* (2006.01)
  *B23K 101/42* (2006.01)
  *B23K 101/40* (2006.01)
  *B23K 103/16* (2006.01)

(52) U.S. Cl.
  CPC .... *B23K 2101/42* (2018.08); *B23K 2103/172* (2018.08); *B23K 2103/42* (2018.08); *B23K 2103/54* (2018.08); *H01L 23/49822* (2013.01)

METHOD OF MANUFACTURING GLASS INTERPOSER

BACKGROUND OF THE INVENTION

Field of the Invention

The present invention relates to a method of manufacturing a glass interposer by use of a glass substrate.

Description of the Related Art

In recent years, there has been a mounting technology in which a plurality of semiconductor chips are mounted through an interposer formed from silicon. The interposer composed of silicon is high in usefulness because a semiconductor manufacturing process technology can be utilized in forming fine wirings, and is high in thermal conductivity and excellent in heat dissipation property (see, for example, Japanese Patent Laid-Open No. 2004-158776). However, the silicon interposer is expensive as compared to an interposer formed from an epoxy resin.

In view of this, a technology has been proposed in which an interposer is formed using a glass substrate which uses an inorganic material, like silicon, and which is inexpensive (see, for example, Japanese Patent Laid-Open Nos. 2015-198212 and 2015-146401). This interposer includes stacked bodies composed of insulating layers (resin layers) and metallic wiring layers on a front surface and a back surface of a glass substrate, and a plurality of through electrodes penetrating the glass substrate. Besides, for dividing the glass substrate to obtain interposers, for example, a cutting blade is made to cut in along preset division lines (streets), to divide the stacked bodies and the glass substrate.

SUMMARY OF THE INVENTION

Here, the insulating layer is formed by spreading a resin on the wiring layers formed on the front surface and the back surface of the glass substrate, and curing the resin by cooling. Since the resin shrinks upon cooling, a stress due to a shrinking force is left in the insulating layer. When the glass substrate is subsequently divided into individual interposers by cutting along division lines, there is a problem of exfoliation of the stacked body from the glass substrate. This exfoliation of the stacked body from the glass substrate is considered to be due to a process in which chippings (recesses) generated at the cut section (kerf) serve as exfoliation starting points. To cope with this problem, cutting may be conducted using a high-numbered cutting blade formed from finer abrasive grains to reduce the ruggedness of the chipping at the cut section, whereby exfoliation of the stacked body can be restrained. This approach, however, cannot perfectly inhibit the exfoliation, and leads to an increase in processing time. In addition, if the stacked bodies and the glass substrate are cut simultaneously, the cutting blade would be caught on the stacked body, causing exfoliation of the stacked body from the glass substrate. Therefore, it is necessary to separately cut the stacked bodies and the glass substrate, leading to an increased processing time.

It is therefore an object of the present invention to prevent exfoliation of the stacked body from the glass substrate when dividing the glass substrate.

In accordance with an aspect of the present invention, there is provided a method of manufacturing a glass interposer by dividing a glass substrate along a plurality of division lines set in a grid pattern into glass interposers of a reduced size, the glass substrate including a plurality of through electrodes penetrating a front surface and a back surface of the glass substrate, stacked bodies having wiring layers and resin layers alternately formed on the front surface and the back surface of the glass substrate, and the division lines, the method including: a first groove forming step of processing the stacked bodies, formed on the front surface and the back surface of the glass substrate, along the division lines to form first grooves having a first width and such a depth as not to reach the glass substrate, while leaving a residual resin portion at bottoms of the first grooves; a second groove forming step of applying a laser beam of such a wavelength as to be absorbed in the resin layer to the bottoms of the first grooves formed in the first groove forming step to perform ablation processing of the residual resin portion, thereby exposing the front surface and the back surface of the glass substrate and forming second grooves having a second width narrower than the first width; a modified layer forming step of applying a laser beam of such a wavelength as to be transmitted through the glass substrate through the second groove on the front surface or the back surface of the glass substrate along the division lines, with a focal point set in inside of the glass substrate, to form modified layers in the inside of the glass substrate; and a dividing step of exerting an external force on the glass substrate to divide the glass substrate, with the modified layers as division starting points, in which the glass interposers obtained by dividing the glass substrate to the reduced size are provided with the stacked bodies on the front surface and the back surface, the stacked bodies each formed at an outer peripheral portion thereof with the residual resin portion formed in the first groove forming step.

In the first groove forming step, it is desirable to form the first grooves by use of a cutting blade.

The method of manufacturing a glass interposer according to the present invention includes: the first groove forming step of processing the stacked bodies formed on the front surface and the back surface of the glass substrate along the division lines to form the first grooves having the first width and such a depth as not to reach the glass substrate, while leaving the residual resin portion at the bottoms of the first grooves; the second groove forming step of applying the laser beam having such a wavelength as to be absorbed in the resin layer to the bottoms of the first grooves to apply ablation processing to the residual resin portion, thereby exposing the front surface and the back surface of the glass substrate and forming the second grooves having the second width narrower than the first width; the modified layer forming step of applying the laser beam of such a wavelength as to be transmitted through the glass substrate through the second groove on the front surface or the back surface of the glass substrate along the division lines, with the focal point set in the inside of the glass substrate, to form the modified layers in the inside of the glass substrate; and the dividing step of exerting an external force on the glass substrate to divide the glass substrate, with the modified layers as division starting point, in which the glass interposers obtained by dividing the glass substrate to the reduced size are provided with the stacked bodies on the front surface and the back surface, the stacked bodies each formed at an outer peripheral portion thereof with the residual resin portion formed in the first groove forming step. Therefore, at the time of dividing the glass substrate, no stress acts on the residual resin portion, so that exfoliation of the stacked body from the glass substrate can be prevented, and the desired glass interposers can be obtained efficiently.

In addition, since the first grooves are formed by use of the cutting blade in the first groove forming step, processing time can be shortened. Further, according to the present invention, the stacked bodies and the glass substrate are not simultaneously divided by the cutting blade, so that there is no possibility that the cutting blade may be caught on the stacked body with the result of exfoliation of the stacked body from the glass substrate, and that an increase in processing time is avoided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Glass Substrate

Figure 1:
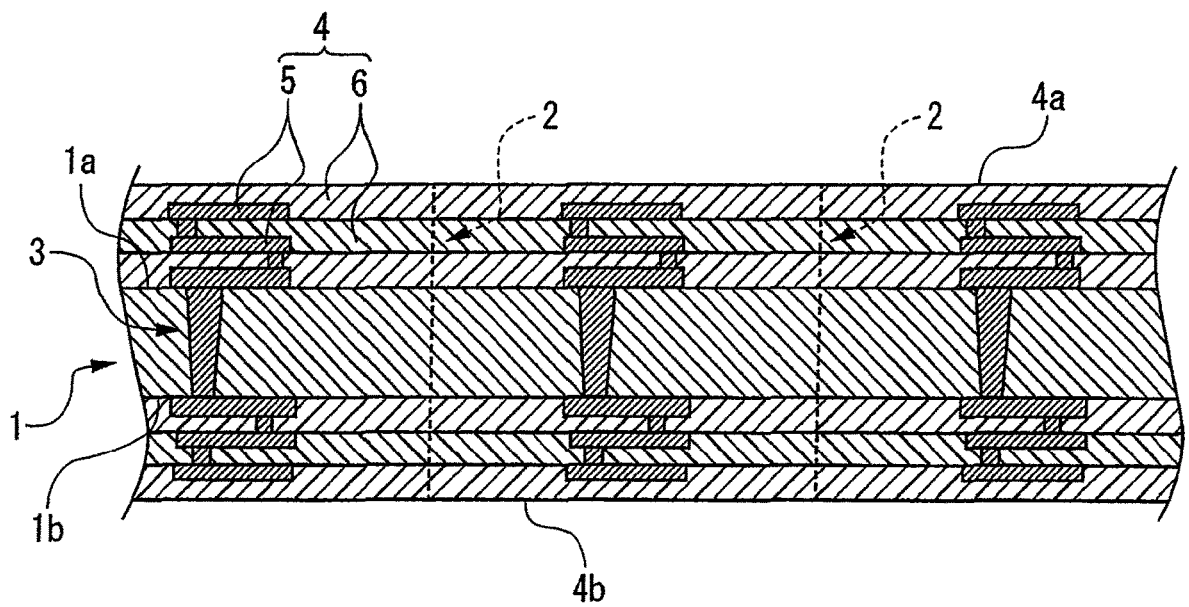
FIG. 1 is a partial enlarged sectional view of a glass substrate.

A glass substrate 1 shown in FIG. 1 is formed in a circular disk shape from a material such as, for example, soda lime glass, no alkali glass or quartz glass. The glass substrate 1 includes division lines (streets) 2 (indicated by dotted line) set in a grid pattern to partition the glass substrate 1 into a plurality of regions, a plurality of through electrodes 3 penetrating a front surface 1a and a back surface 1b of the glass substrate 1, and stacked bodies 4 having wiring layers 5 and resin layers 6 alternately formed on the front surface 1a and the back surface 1b of the glass substrate 1.

The resin layers 6 are insulating layers, while the wiring layers 5 are composed of a conductor such as a metal. The wiring layers 5 adjacent to each other are insulated from each other by the resin layer 6. In the glass substrate 1 shown in the present embodiment, an exposed surface 4a of the stacked body 4 stacked on the front surface 1a of the glass substrate 1 is a stacking surface for semiconductor chips. On the other hand, an exposed surface 4b of the stacked body 4 stacked on the back surface 1b of the glass substrate 1 is a substrate mounting surface. The wiring layers 5 on the front surface 1a side and the wiring layers 5 on the back surface 1b side are connected by the through electrodes 3.

2. Method of Manufacturing Glass Interposer

A method of manufacturing a glass interposer by dividing the above-mentioned glass substrate 1 into a plurality of glass interposers of a reduced size will be described in detail below.

(1) First Groove Forming Step

Figure 2:
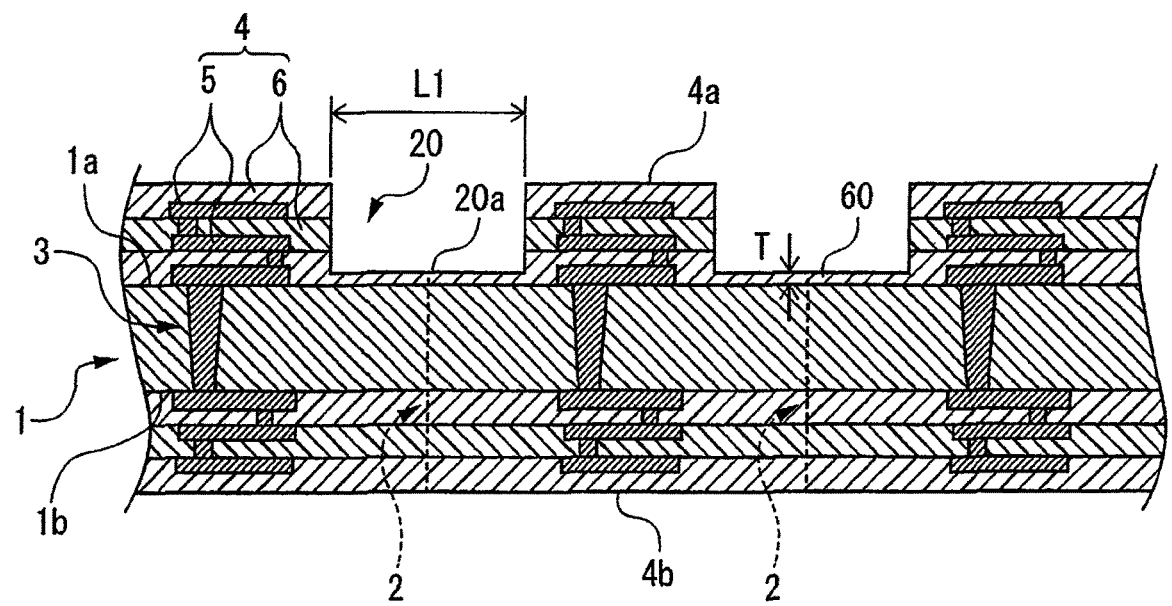
FIG. 2 is a partial enlarged sectional view showing a first groove forming step.

As shown in FIG. 2, a cutting step is conducted in which the front surface 1a and the back surface 1b are processed along the division lines 2 to form first grooves 20 having a first width L1 and such a depth as not to reach the glass substrate 1. In the first groove forming step, it is desirable to form the first grooves 20 by using, for example, a cutting blade 10, as shown in FIG. 3.

The cutting blade 10 is composed of a cutting edge formed by binding, for example, diamond abrasive grains or CBN (Cubic Boron Nitride) abrasive grains with a bonding material. The materials of the abrasive grains and the bonding material constituting the cutting blade 10 are appropriately set according to the materials of the stacked bodies 4 and the like. The particle diameter of the abrasive grains contained in the cutting blade 10 is not particularly limited, and is, for example, approximately 20 μm to 40 μm, preferably approximately 25 μm to 35 μm. In addition, the width of the cutting blade 10 also is not specifically restricted, and is set in the range of, for example, approximately 150 μm to 500 μm, preferably approximately 200 μm to 300 μm. Though not illustrated, the cutting blade 10 is mounted to a tip of a spindle having an axis parallel to a horizontal direction, and, when the spindle is rotated, the cutting blade 10 is also rotated.

Figure 3A:
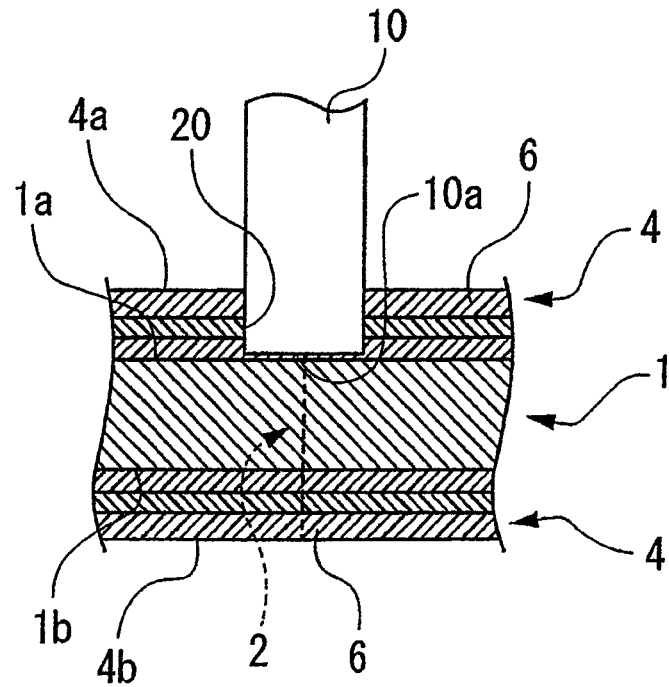
FIGS. 3A and 3B are partial enlarged sectional views showing a state in which a first groove is formed by use of a cutting blade.

First, the back surface 1b side of the glass substrate 1 is held by a holding table (not shown), with the front surface 1a side directed to the upper side. As shown in FIG. 3A, the glass substrate 1 is moved to the lower side of the cutting blade 10, and alignment of the cutting blade 10 and the division line 2 to be cut is conducted. Subsequently, with the cutting blade 10 in rotation, a cutting edge 10a of the cutting blade 10 is made to cut in from the exposed surface 4a side of the stacked body 4 to such a depth as not to reach the glass substrate 1, and the glass substrate 1 and the cutting blade 10 are put into a relative horizontal movement. Thus, the first groove 20 having the first width L1 and such a depth as not to reach the glass substrate 1 as shown in FIG. 2 is formed along the division line 2 by the rotating cutting blade 10, while leaving a residual resin portion 60 having a thickness T at a bottom 20a of the first groove 20.

Figure 3B:
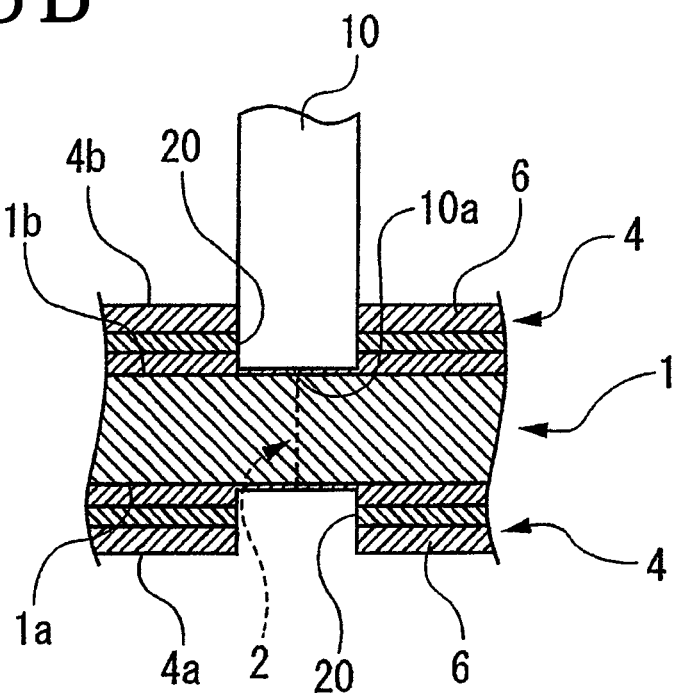

The first width L1 is sized according to the width of the cutting blade 10. The thickness T of the residual resin portion 60 left at the bottom 20a of the first groove 20 is a small thickness of, for example, approximately 20 μm. After the first grooves 20 are formed in the stacked body 4 on the front surface 1a side of the glass substrate 1 along all the division lines 2, the glass substrate 1 is inverted front side back, as shown in FIG. 3B, then, with the cutting blade 10 in rotation, the cutting edge 10a of the cutting blade 10 is made to cut in from the exposed surface 4b side of the stacked body 4 to such a depth as not to reach the glass substrate 1, and the glass substrate 1 and the cutting blade 10 are put into a relative horizontal movement, to form the first groove 20, while leaving the residual resin portion 60 at the bottom 20a of the first groove 20 shown in FIG. 2, in the same manner as above. When the first grooves 20 have been formed in the stacked body 4 on the back surface 1b side of the glass substrate 1 along all the division lines 2, the first groove forming step is completed.

While a case in which the first grooves 20 are formed in the stacked body 4 stacked on the front surface 1a of the glass substrate 1 by use of the cutting blade 10 and then the first grooves 20 are formed in the stacked body 4 stacked on the back surface 1b of the glass substrate 1 by use of the cutting blade 10 has been described in the present embodiment, this case is not limitative of the present invention.

Thus, formation of the first grooves 20 in the stacked body 4 stacked on the back surface 1*b* of the glass substrate 1 may be followed by formation of the first grooves 20 in the stacked body 4 stacked on the front surface 1*a* of the glass substrate 1.

With the first groove forming step carried out by use of the cutting blade 10, the first groove 20 can be formed along one division line 2 by one pass (one-time processing feeding) of cutting operation, and, therefore, a shortening in processing time can be realized. Note that the first groove forming step may be carried out by ablation processing through applying a laser beam, but, in that case, the number of passes of applying the laser beam is increased, and more processing time is required, as compared to the case of forming the first grooves 20 by the cutting blade 10. For this reason, it is preferable to carry out the first groove forming step by use of the cutting blade 10.

(2) Second Groove Forming Step

Figure 4:
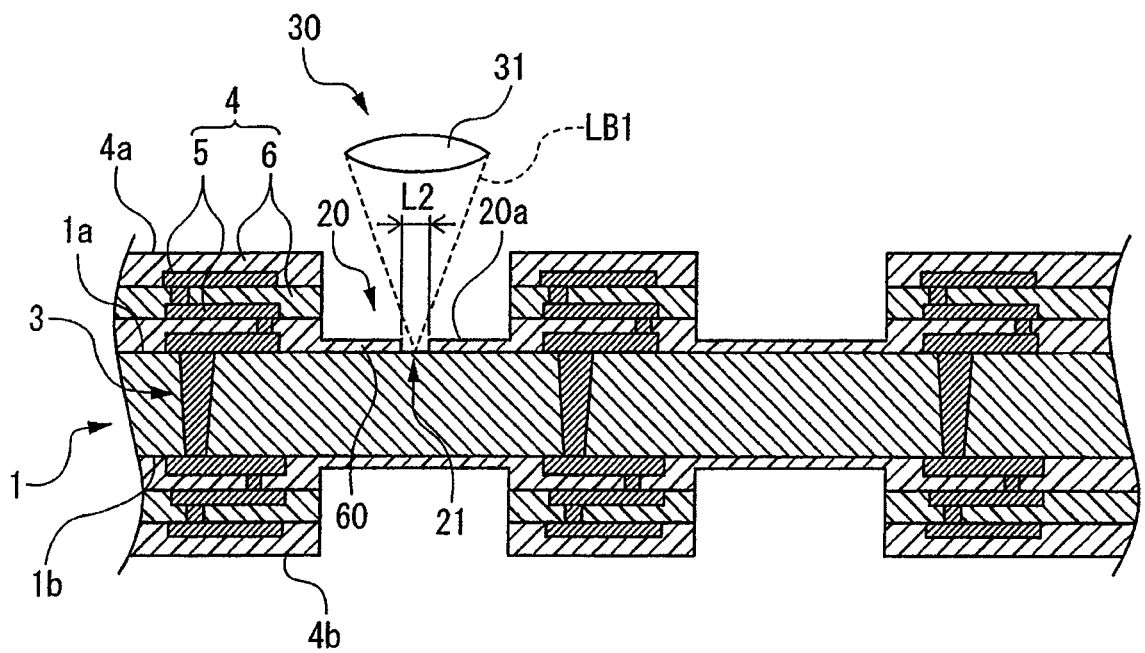
FIG. 4 is a partial enlarged sectional view showing a second groove forming step.

As shown in FIG. 4, ablation processing is applied to the bottom 20*a* of the first groove 20, which has been formed in the first groove forming step, by use of laser beam applying means 30. The laser beam applying means 30 includes a processing head (not shown) that applies a laser beam LB1 of such a wavelength as to be absorbed in the resin layer 6, a focusing lens 31 incorporated in the processing head for focusing the laser beam LB1, and a position adjustment unit (not shown) for adjusting the position of a focal point of the laser beam LB1.

In performing the ablation processing, the back surface 1*b* side of the glass substrate 1 is held by the holding table in such a manner that the exposed surface 4*a* of the stacked body 4 stacked on the front surface 1*a* of the glass substrate 1 is exposed to the upper side. Next, alignment of the first groove 20 and the processing head of the laser beam applying means 30 is conducted, and the focal point of the laser beam LB1 is adjusted to the height position of the front surface 1*a* of the glass substrate 1.

While the laser beam applying means 30 and the glass substrate 1 are being in a relative movement in a direction parallel to the glass substrate 1, a laser beam LB1 having such a wavelength as to be absorbed in the bottom 20*a* of the first groove 20 is applied from the processing head, whereby the residual resin portion 60 is subjected to ablation processing to expose the front surface 1*a* of the glass substrate 1, thereby forming a second groove 21 having a second width L2 narrower than the first width L1 shown in FIG. 2. The second width L2 is not particularly limited, and is set, for example, in the range of 50 μm to 150 μm.

After the second grooves 21 are formed in the stacked body 4 on the front surface 1*a* side of the glass substrate 1 along all the first grooves 20, the glass substrate 1 is inverted front side back, then, while the laser beam applying means 30 and the glass substrate 1 are being in a relative movement in a direction parallel to the glass substrate 1, ablation processing is applied to the residual resin portion 60 in the same manner as above, to form the second groove 21 for exposing the back surface 1*b* of the glass substrate 1. Then, when the second grooves 21 have been formed in the stacked body 4 on the back surface 1*b* side of the glass substrate 1 along all the first grooves 20, the second groove forming step is completed. Note that the number of passes of applying the laser beam LB1 is not particularly limited, and the second groove 21 may be formed by applying the laser beam LB1 divisionally a plurality of times along one first groove 20.

While a case in which the second grooves 21 along the first grooves 20 are formed in the stacked body 4 on the front surface 1*a* side of the glass substrate 1 and then the second grooves 21 along the first grooves 20 are formed in the stacked body 4 on the back surface 1*b* side of the glass substrate 1 has been described in the present embodiment, this case is not restrictive of the present invention. Thus, formation of the second grooves 21 along the first grooves 20 in the stacked body 4 on the back surface 1*b* side of the glass substrate 1 may be followed by formation of the second grooves 21 along the first grooves 20 in the stacked body 4 on the front surface 1*a* side of the glass substrate 1.

(3) Modified Layer Forming Step

Figure 5:
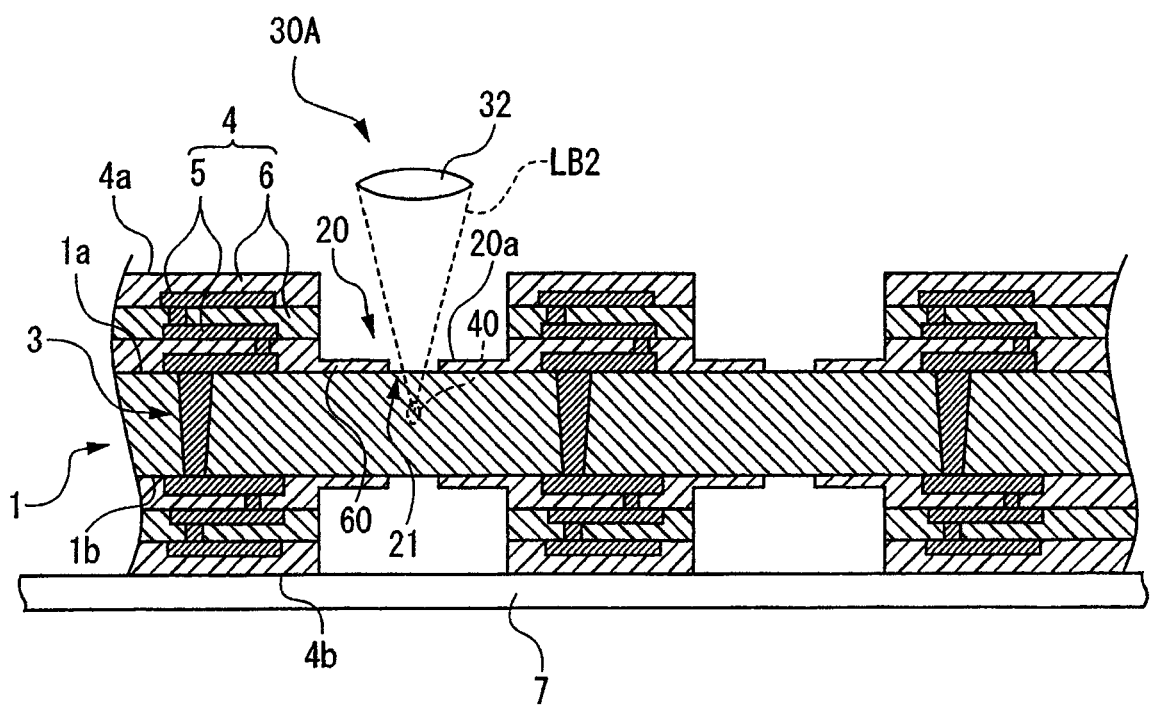
FIG. 5 is a partial enlarged sectional view showing a modified layer forming step.

As shown in FIG. 5, by use of laser beam applying means 30A, a laser beam LB2 of such a wavelength as to be transmitted through the glass substrate 1 is applied toward the glass substrate 1, to form a modified layer 40. The laser beam applying means 30A includes a processing head (not shown) that applies the laser beam LB2 of such a wavelength as to be transmitted in the glass substrate 1, a focusing lens 32 incorporated in the processing head for focusing the laser beam LB2, and a position adjustment unit (not shown) for adjusting the position of a focal point of the laser beam LB2.

First, an adhesive tape 7 is adhered to the exposed surface 4*b* of the stacked body 4 stacked on the back surface 1*b* of the glass substrate 1, and then the back surface 1*b* side of the glass substrate 1 is held by a holding table through the adhesive tape 7, in such a manner that the exposed surface 4*a* of the stacked body 4 stacked on the front surface 1*a* is exposed to the upper side. Note that the adhesive tape 7 need only be expandable, and, for example, an expandable tape in which an adhesive layer is stacked on a base material layer of a polyolefin or polyvinyl chloride or the like can be used.

Next, the laser beam applying means 30A is lowered in the direction for bringing the focusing lens 32 closer to the glass substrate 1, to position a focal point of the laser beam LB2 in the inside of the glass substrate 1. In the state in which the focal point of the laser beam LB2 is positioned in the inside of the glass substrate 1, the laser beam applying means 30A and the glass substrate 1 are put into a relative movement in a direction parallel to the glass substrate 1, and, while keeping the relative movement, the processing head applies the laser beam LB2 from the second groove 21 in the front surface 1*a* of the glass substrate 1 along the division line 2 shown in FIG. 1, whereby a modified layer 40 is formed. The modified layer 40 is a region where the strength or other physical property of the inside of the glass substrate 1 has been changed by application of the laser beam LB2, and it serves as a division starting point. The laser beam LB2 is repeatedly applied along all the division lines 2, whereby the modified layers 40 are formed in the inside of the glass substrate 1.

Figure 6:
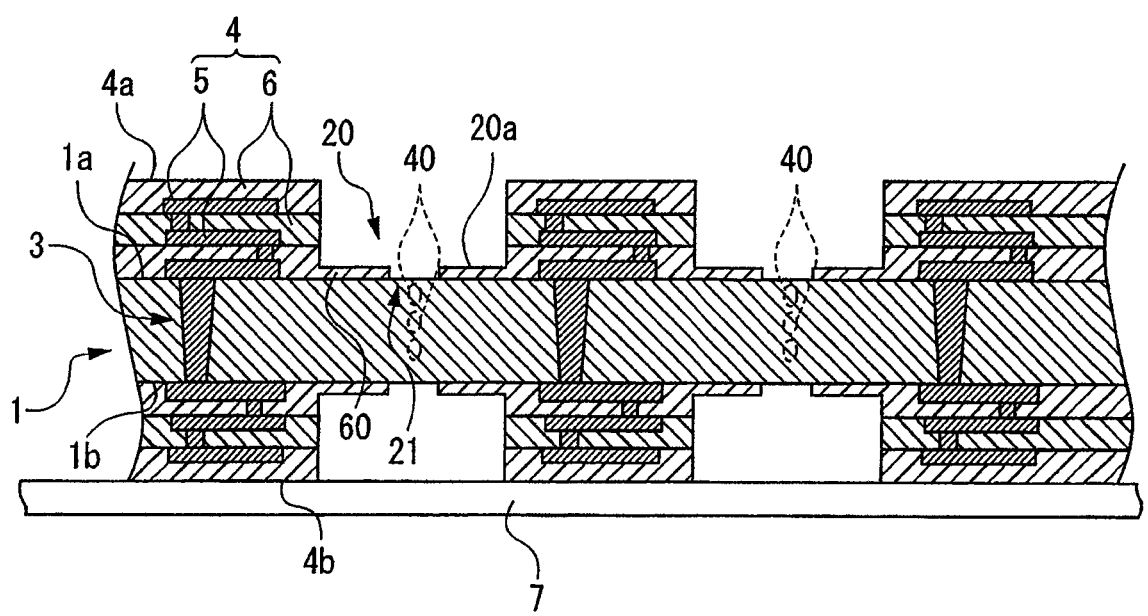
FIG. 6 is a partial enlarged sectional view of the glass substrate after the modified layer forming step has been performed.

Here, the number of the modified layer (or layers) 40 formed in the thickness direction inside the glass substrate 1 may be one or may be two or more. Therefore, in the case of forming a plurality of modified layers 40 in the thickness direction inside the glass substrate 1, the laser beam applying means 30A shifts the position of the focusing lens 32 in such a manner as to position the focal point of the laser beam LB2 more on the back surface 1*b* side of the glass substrate 1, and applies the laser beam LB2, to form the modified layer 40. Then, the laser beam applying means 30A shifts the position of the focusing lens 32 toward the upper side, such as to sequentially position the focal point of the laser beam LB2 at positions with regular intervals from the back surface 1*b* side toward the front surface 1*a* side, and applies the laser beam LB2, to form a plurality of modified layers 40 in the thickness direction inside the glass substrate 1. In this way, the formation of the modified layer 40 by application of the laser beam LB2 may be conducted repeatedly, to form, for example, three modified layers 40 in the thickness direction inside the glass substrate 1, as shown in FIG. 6.

While the modified layer 40 has been formed from the front surface 1a side of the glass substrate 1 in the present embodiment, the modified layer 40 may be formed by applying the laser beam LB2 from the back surface 1b side of the glass substrate 1 to the inside of the glass substrate 1 along the division line 2.

(4) Dividing Step

Figure 7:
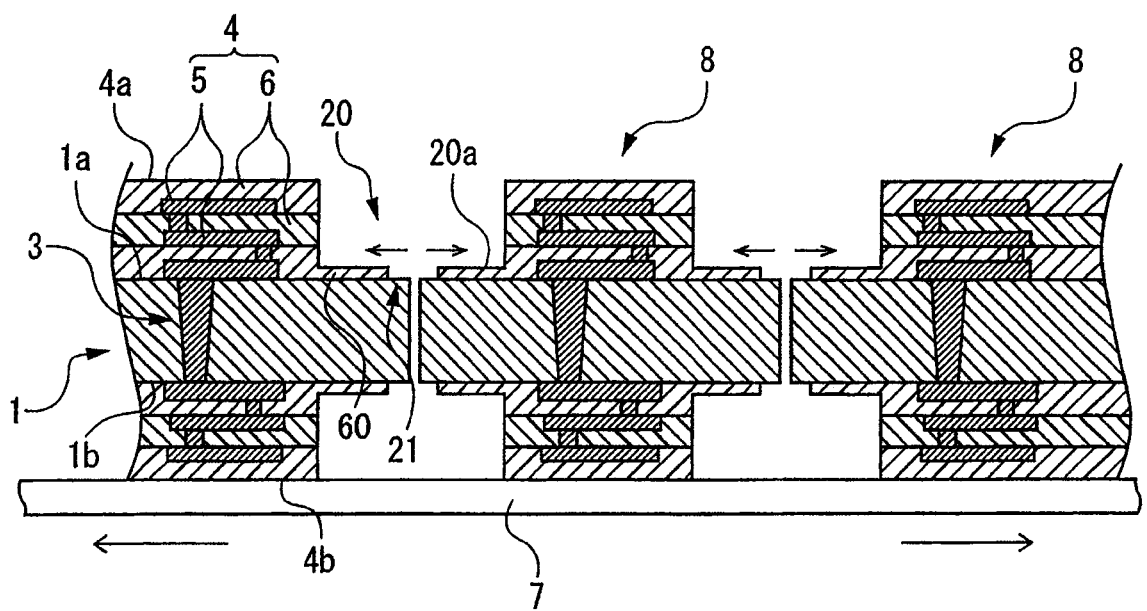
FIG. 7 is a partial enlarged sectional view showing a dividing step.

As shown in FIG. 7, an external force is exerted on the glass substrate 1 to divide the glass substrate 1, with the modified layers 40 as division starting points. For example, by use of an expanding apparatus capable of expanding the adhesive tape 7 in the plane directions of the glass substrate 1, the outer peripheral sides of the adhesive tape 7 are pulled outward, to expand the adhesive tape 7. When an external force is exerted on the glass substrate 1 attendant on the expansion of the adhesive tape 7, the glass substrate 1 is divided, with the modified layers 40 shown in FIG. 6 as division starting points, into a plurality of glass interposers 8 of a small size.

Figure 8:
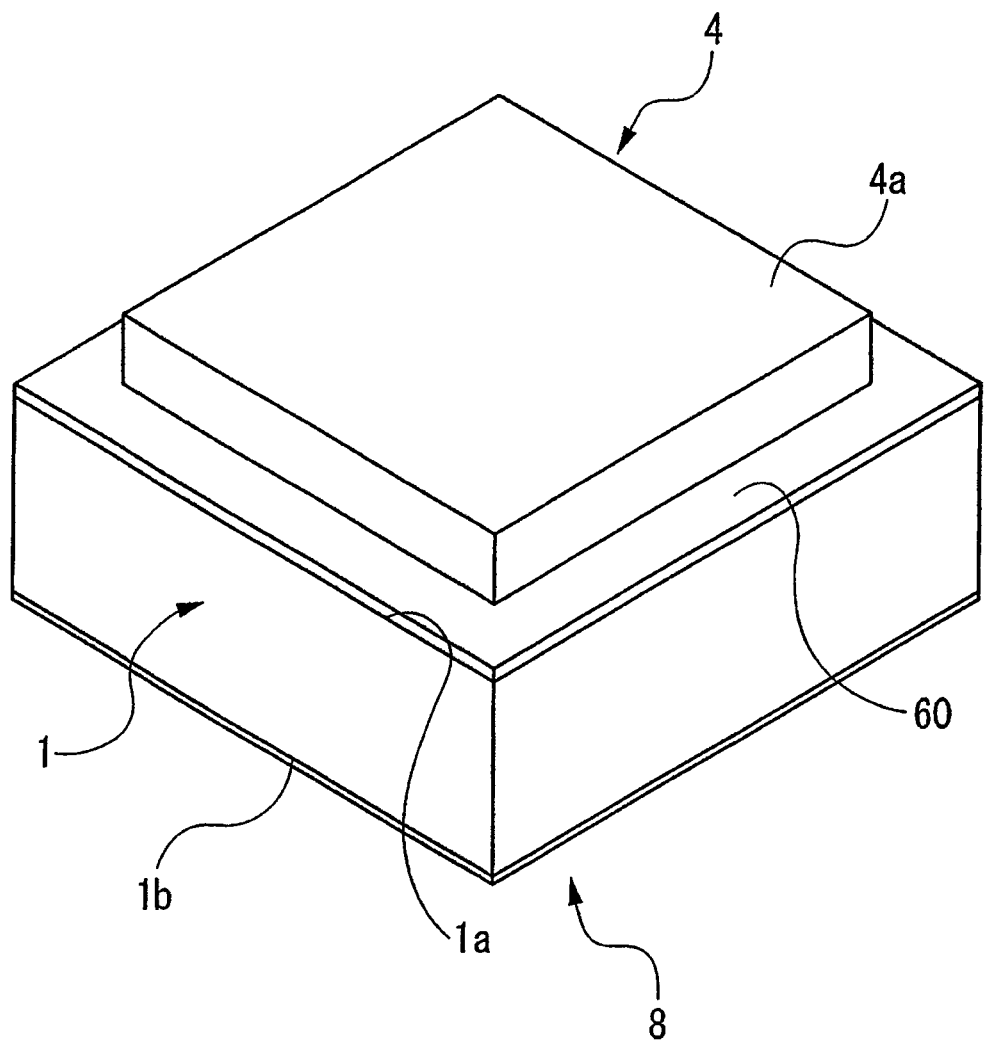
FIG. 8 is a perspective view of a glass interposer.

As shown in FIG. 8, the glass interposer 8 has the stacked bodies 4, each having the residual resin portion 60 formed in the first groove forming step at an outer peripheral portion thereof, on the front surface 1a and the back surface 1b of the glass substrate 1. Here, in the resin layer 6 constituting the stacked body 4, a residual stress due to shrinkage upon formation (cooling and curing) of the stacked body 4 exists, but, since the residual resin portion 60 left at the bottom 20a of the first groove 20 shown in FIG. 7 is thin, no stress acts on the residual resin portion 60 when the glass substrate 1 is divided by exerting an external force thereon. Therefore, exfoliation of the stacked body 4 from the glass substrate 1 is avoided, and the plurality of glass interposers 8 of a reduced size can be obtained from the glass substrate 1.

The apparatus for exerting an external force on the glass substrate 1 is not limited to the above-mentioned expanding apparatus. For example, a breaking apparatus capable of breaking the glass substrate 1, while exerting a bending stress thereon by a braking blade, into the individual glass interposers 8 may be used.

Thus, in the method of manufacturing a glass interposer according to the present invention, the stacked bodies 4 formed on the front surface 1a and the back surface 1b of the glass substrate 1 are processed along the division lines 2 to form the first grooves 20 having the first width L1 and such a depth as not to reach the glass substrate 1, while leaving the residual resin portion 60 at the bottoms 20a of the first grooves 20, after which the residual resin portion 60 is subjected to ablation processing to expose the front surface 1a and the back surface 1b of the glass substrate 1 and form the second grooves 21 having the second width L2 narrower than the first width L1, then the laser beam LB2 is applied from the second grooves 21 along the division lines 2 to form the modified layers 40 in the inside of the glass substrate 1, and an external force is exerted on the glass substrate 1 to divide the glass substrate 1, with the modified layers 40 as division starting points. Therefore, at the time of dividing the glass substrate 1, no stress acts on the residual resin portion 60 left at the bottoms 20a of the first grooves 20, exfoliation of the stacked bodies 4 from the glass substrate 1 is avoided, and the desired glass interposers 8 can be obtained efficiently.

In addition, in the present invention, the first groove forming step is carried out using the cutting blade 10, and, therefore, processing time can be shortened. Further, according to the present invention, the stacked bodies 4 and the glass substrate 1 are not simultaneously divided by the cutting blade 10, so that there is no possibility that the cutting blade 10 may be caught on the stacked body 4, causing the stacked body 4 to be exfoliated from the glass substrate 1, and an increase in processing time can be avoided.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing a glass interposer by dividing a glass substrate along a plurality of division lines set in a grid pattern into glass interposers of a reduced size, the glass substrate including a plurality of through electrodes penetrating a front surface and a back surface of the glass substrate, stacked bodies having wiring layers and resin layers alternately formed on the front surface and the back surface of the glass substrate, and the division lines, the method comprising:

a first groove forming step of processing the stacked bodies, formed on the front surface and the back surface of the glass substrate, along the division lines to form first grooves having a first width and such a depth as not to reach the glass substrate, while leaving a residual resin portion at bottoms of the first grooves;

a second groove forming step of applying a laser beam of such a wavelength as to be absorbed in the resin layer to the bottoms of the first grooves formed in the first groove forming step to perform ablation processing of the residual resin portion, thereby exposing the front surface and the back surface of the glass substrate and forming second grooves in the residual resin portion having a second width narrower than the first width;

a modified layer forming step of applying a laser beam of such a wavelength as to be transmitted through the glass substrate through the second groove on the front surface or the back surface of the glass substrate along the division lines, with a focal point set in inside of the glass substrate, to form modified layers in the inside of the glass substrate; and a dividing step of exerting an external force on the glass substrate to divide the glass substrate, with the modified layers as division starting points, wherein the glass interposers obtained by dividing the glass substrate to the reduced size are provided with the stacked bodies on the front surface and the back surface, the stacked bodies each formed at an outer peripheral portion thereof with the residual resin portion formed in the first groove forming step.

2. The method of manufacturing the glass interposer according to claim 1, wherein the first groove forming step includes forming the first grooves by use of a cutting blade.

* * * * *